United States Patent
Shen et al.

[19]
[11] Patent Number: 6,165,864
[45] Date of Patent: Dec. 26, 2000

[54] TAPERED ELECTRODE FOR STACKED CAPACITORS

[75] Inventors: Hua Shen, Beacon; Joachim Nuetzel, Fishkill; Carl J. Radens, LaGrangeville; David Kotecki, Hopewell Junction, all of N.Y.

[73] Assignee: Siemens Aktiengesellschaft, Munich, Germany

[21] Appl. No.: 09/123,298

[22] Filed: Jul. 28, 1998

[51] Int. Cl.[7] .................................................... H01L 21/20
[52] U.S. Cl. ........................ 438/396; 438/253; 438/640; 438/673; 438/713
[58] Field of Search .................................... 257/303, 304, 257/306, 309; 438/40, 43, 239, 244, 253, 254, 258, 271, 387, 397, 396, 638, 640, 673, 713

[56] References Cited

U.S. PATENT DOCUMENTS

| | | | |
|---|---|---|---|
| 5,012,309 | 4/1991 | Nakayama | 365/149 |
| 5,307,310 | 4/1994 | Narita | 257/302 |
| 5,691,219 | 11/1997 | Kawakubo | 438/253 |
| 5,843,845 | 12/1998 | Chung | 438/713 |
| 5,973,347 | 10/1999 | Nagatomo | 257/306 |

FOREIGN PATENT DOCUMENTS

| | | |
|---|---|---|
| 7-045718 | 2/1995 | Japan . |
| 10-093041 | 4/1998 | Japan . |
| 10-093045 | 4/1998 | Japan . |

*Primary Examiner*—Olik Chaudhuri
*Assistant Examiner*—Hoai Pham
*Attorney, Agent, or Firm*—Donald B. Paschburg

[57] ABSTRACT

A method for forming a stacked capacitor includes the steps of providing a first insulating layer having a conductive access path therethrough, forming a second insulating layer on the first insulating layer, forming a trench in the second insulating layer, the trench having tapered sidewalls, forming a first electrode in the trench and on the trench sidewalls, the first electrode being electrically coupled to the conductive access path, forming a dielectric layer on the first electrode and forming a second electrode on the dielectric layer. A stacked capacitor having increased surface area includes a first electrode formed in a trench provided in a dielectric material. The first electrode has tapered surfaces forming a conically shaped portion of the first electrode, the first electrode for accessing a capacitively coupled storage node.

17 Claims, 6 Drawing Sheets

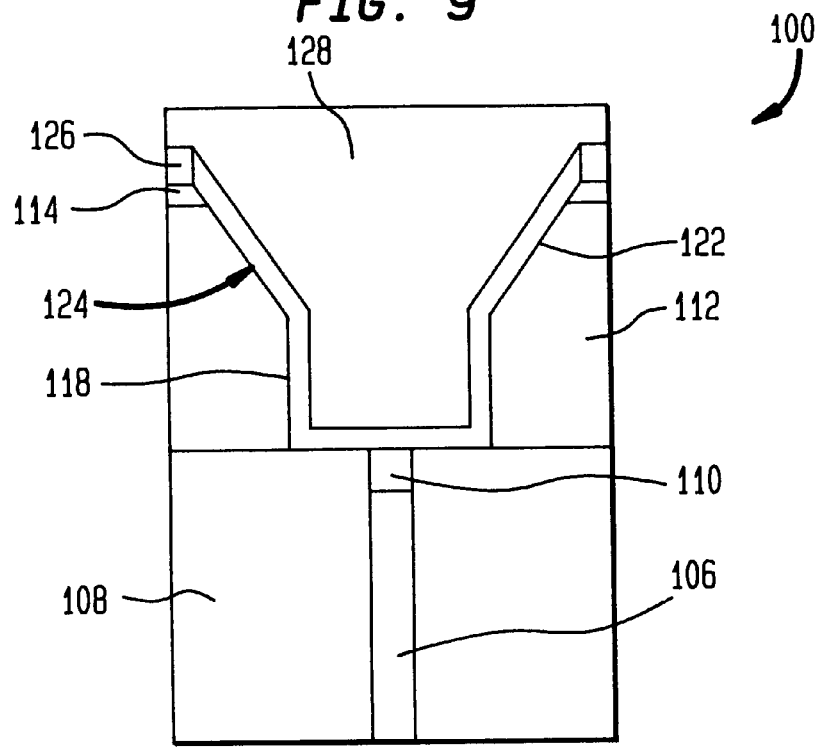
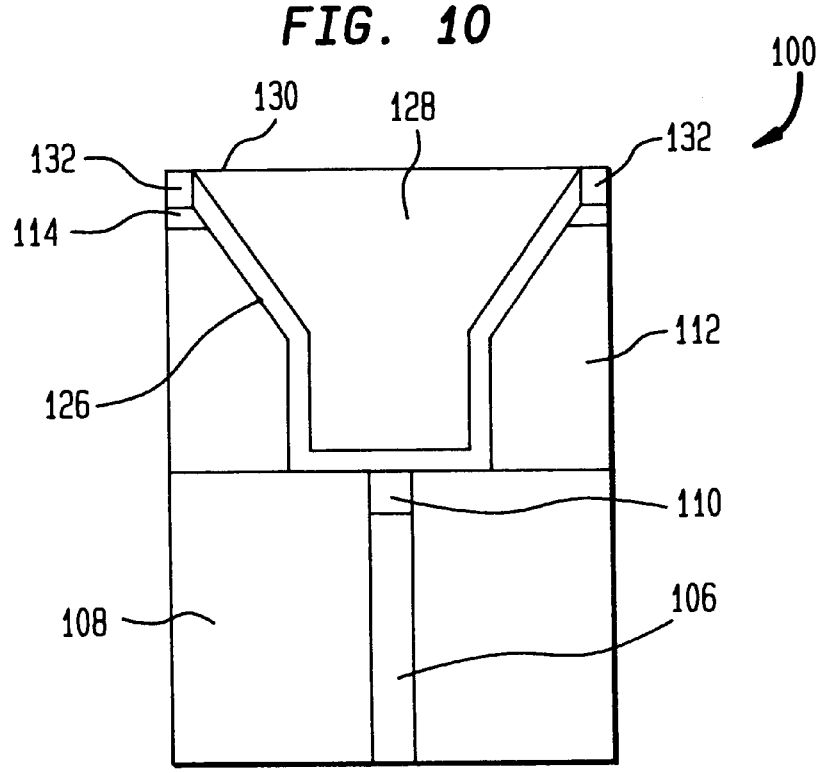

TAPERED ELECTRODE FOR STACKED CAPACITORS

BACKGROUND

1. Technical Field

This disclosure relates to stack capacitors for semiconductor devices and more particularly, to an improved method and apparatus for capacitor electrodes suitable for use with feature sizes of .15 microns and beyond.

2. Description of the Related Art

Semiconductor memory cells include capacitors accessed by transistors to store data. Data is stored by as a high or low bit depending on the state of the capacitor. The capacitor's charge or lack of charge indicates a high or low when accessed to read data, and the capacitor is charged or discharged to write data thereto.

Stacked capacitors are among the types of capacitors used in semiconductor memories. Stacked capacitors are typically located on top of the transistor used to access a storage node of the capacitor as opposed to trench capacitors which are buried in the substrate of the device. As with many electrical devices, high conductivity is beneficial for performance characteristics of stacked capacitors.

In semiconductor memories, such as dynamic random access memories (DRAM), high dielectric constant capacitor formation processes include deposition of highly dielectric materials. In one type of high dielectric constant capacitors, a layer of high dielectric constant materials, such as barium strontium titanium oxide (BSTO), is deposited in an oxidized atmosphere.

Referring to FIG. 1, a structure 2 with stacked capacitors is shown. Stacked capacitors 3 include two electrodes, a top electrode or storage node 4, (usually platinum) and a bottom electrode 12 separated by a dielectric layer 18. An access transistor 5 includes a gate 6 which when activated electrically couples a bitline 7 through a bitline contact 8 to a plug 14. Plug 14 connects to electrode 12 through a diffusion barrier 16 and charge is stored on electrode 12.

During fabrication of a conventional stacked capacitor 10 as shown in FIG. 2, a bottom electrode 12 is deposited and patterned on a dielectric layer 20. Prior to the formation of bottom electrodes 12 a plug 14 and a diffusion barrier 16 are formed in dielectric layer 20. Plug 14 is preferably polycrystalline silicon (polysilicon or poly). Electrode 12 is preferably formed of platinum (Pt) and is relatively thick. To form individual bottom electrodes, a reactive ion etch (RIE) process is preferably employed. This process has been known to be very difficult to perform on thick films. More difficulty is experienced when fabricating bottom electrodes 12 due to the tendency of the etched surface to taper.

Typically the etched surfaces taper at an angle of about 65° or less as shown in FIG. 3. FIG. 3 indicates a maximum achievable height based on the best taper angle (65°) condition. It is apparent that the maximum height of electrode 12 is limited due to the tapering. This limitation also limits a surface area of electrode 12 making it particularly difficult to implement for smaller feature sizes, such as for features sizes of about 0.15 microns.

Referring to FIG. 4, a noble metal sidewall compound stack design is shown. A dielectric layer 22 having a plug 24 formed therein has a barrier layer 26 formed on top of dielectric layer 22. Sidewalls 28 are formed from a noble metal such as Pt or Pt/Ir (iridium). Sidewalls 28 become the bottom electrode for the stacked capacitor. Also, a dielectric layer 30, such as an oxide, is applied as shown. This design does not suffer from the tapering as described above, however the formation of the metal sidewall requires good conformality which is difficult to achieve for sputtered metal on a vertical surface. Further, the electrode height is limited due to conformality problems of both the sidewall metal films and the high dielectric constant material (i.e. BSTO) which is deposited thereon in later steps.

Therefore, a need exists for a method and apparatus for improving the surface area of bottom electrode for stacked capacitors while maintaining an appropriate height of the bottom electrode. A further need exists for a bottom electrode suitable for use with a feature size of .15 microns or less.

SUMMARY OF THE INVENTION

A method for forming a stacked capacitor includes the steps of providing a first insulating layer having a conductive access path therethrough, forming a second insulating layer on the first insulating layer, forming a trench in the second insulating layer, the trench having tapered sidewalls, forming a first electrode in the trench and on the trench sidewalls, the first electrode being electrically coupled to the conductive access path, forming a dielectric layer on the first electrode and forming a second electrode on the dielectric layer.

In other methods of the present invention, the step of forming a trench in the second insulating layer, the trench having tapered sidewalls may include the step of forming the trench by reactive ion etching. The tapered sidewalls preferably form a conical shaped portion in the trench. The step of forming a first electrode in the trench and on the trench sidewalls may include the step of depositing a metal layer in the trench which covers the sidewalls. The step of adjusting a taper angle of the sidewalls may also be included. The step of forming a dielectric layer on the first electrode may include the step of forming a layer of barium strontium titanium oxide. The first electrode preferably includes platinum. The step of forming a trench in the second insulating layer, the trench having tapered sidewalls may further include the steps of depositing a resist material in the trench, recessing the resist material to a predetermined depth within the trench and anisotropically etching the trench sidewalls to form tapered surfaces.

A method of fabricating a stacked capacitor for a semiconductor device, in accordance with the present invention, includes the steps of providing a first insulating layer having a conductive plug formed therethrough, the conductive plug for connecting to an access transistor of the semiconductor device, forming a second insulating layer on the first insulating layer, etching a trench in the second insulating layer to gain access to the conductive plug, tapering sidewalls of the trench to form tapered surfaces within the trench, forming a first electrode in the trench and on the tapered surfaces, the first electrode being electrically coupled to the conductive plug, forming a dielectric layer on the first electrode and forming a second electrode on the dielectric layer.

In other methods of fabricating a stacked capacitor for a semiconductor device, the semiconductor device is a memory chip. The step of etching a trench in the second insulating layer to gain access to the conductive plug may include the step of reactive ion etching the trench. The tapered surfaces preferably form a conical shaped portion in the trench. The step of tapering sidewalls of the trench to form tapered surfaces within the trench may include an anisotropic etch process. The step of adjusting a taper angle of the tapered surfaces may also be included. The step of forming a dielectric layer on the first electrode may include the step of forming a layer of barium strontium titanium oxide. The first electrode preferably includes platinum. The step of tapering sidewalls of the trench to form tapered surfaces within the trench may include the steps of depositing a resist material in the trench, recessing the resist material to a predetermined depth within the trench and anisotropically etching trench sidewalls to form the tapered surfaces.

A stacked capacitor having increased surface area in accordance with the present invention includes a first electrode formed in a trench provided in a dielectric material. The first electrode has tapered surfaces forming a conically shaped portion of the first electrode. The first electrode accesses a capacitively coupled storage node.

In alternate embodiments of the stacked capacitor, the first electrode preferably includes a noble metal. The first electrode more preferably includes platinum. The first electrode and the storage node have a dielectric layer disposed therebetween. The dielectric layer preferably includes barium strontium titanium oxide. A semiconductor device may include the stacked capacitor in accordance with the invention.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 9 is a cross-sectional view of the trench of FIG. 8 showing a metal layer deposited in the trench and on the tapered surfaces to form a bottom electrode and the trench filled with a protective dielectric material in accordance with the present invention;

FIG. 10 is a cross-sectional view of the trench of FIG. 9 showing the protective dielectric material having a planarized top surface in accordance with the present invention;

DETAILED DESCRIPTION OF PREFERRED EMBODIMENTS

The present disclosure relates to stack capacitors for semiconductor devices and more particularly, to an improved bottom electrode and method of formation thereof. A stacked capacitor in accordance with the present invention includes the formation of a dielectric material having a tapered opening formed therein. Tapered surfaces of the opening provide surfaces for the deposition of a bottom electrode in accordance with the present invention. The tapered surfaces provide increased surface area for the capacitor while improving conformality of metal and high dielectric layers deposited on the tapered surfaces in later steps.

Figure 5:
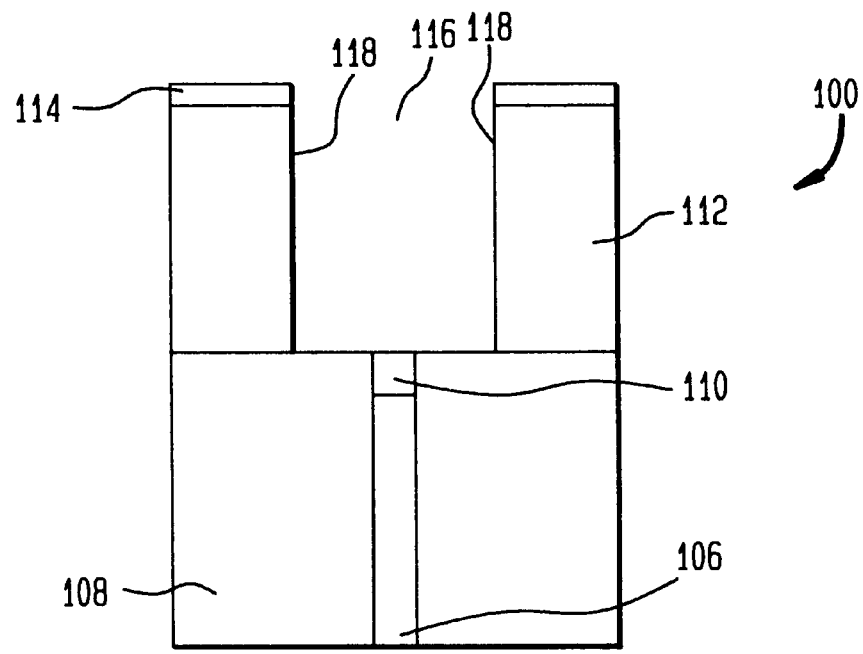
FIG. 5 is a cross-sectional view of a trench formed in a dielectric layer for a stacked capacitor in accordance with the present invention.

Referring now in specific detail to the drawings in which like reference numerals identify similar or identical elements throughout the several views, FIG. 5 shows a partially fabricated stacked capacitor 100 in accordance with the present invention. A plug 106 is formed inside a dielectric layer 108. Dielectric layer 108 may include silicon dioxide material. A diffusion barrier 110 is formed at a top portion of plug 106. Diffusion barrier 110 preferably includes TaN, CoSi, TiN, WSi, TaSiN or equivalent materials. Another dielectric layer 112 is deposited on dielectric layer 108. Dielectric layer 112 is preferably an oxide such as silicon dioxide and may be deposited by a chemical vapor deposition (CVD) or a plasma enhanced chemical vapor deposition (PECVD) process.

A mask layer 114 is deposited on dielectric layer 112. Mask layer preferably includes a nitride such as silicon nitride. Mask layer is coated with a resist (not shown) which is developed in a predetermined pattern using photolithographic techniques known in the art. Mask layer 114 is thereby etched to expose a portion of dielectric layer 112 which will be the site of stacked capacitor electrodes. An anisotropic dry etching process, such as reactive ion etching (RIE) is performed to remove dielectric layer 112 down to dielectric layer 108. The result is a trench or opening 116 in communication with barrier 110 and plug 106 at the site where a capacitor electrode is to be placed. Sidewalls 118 are substantially vertical due to the anisotropic RE process. The resist is then removed for further processing to occur.

Figure 6:
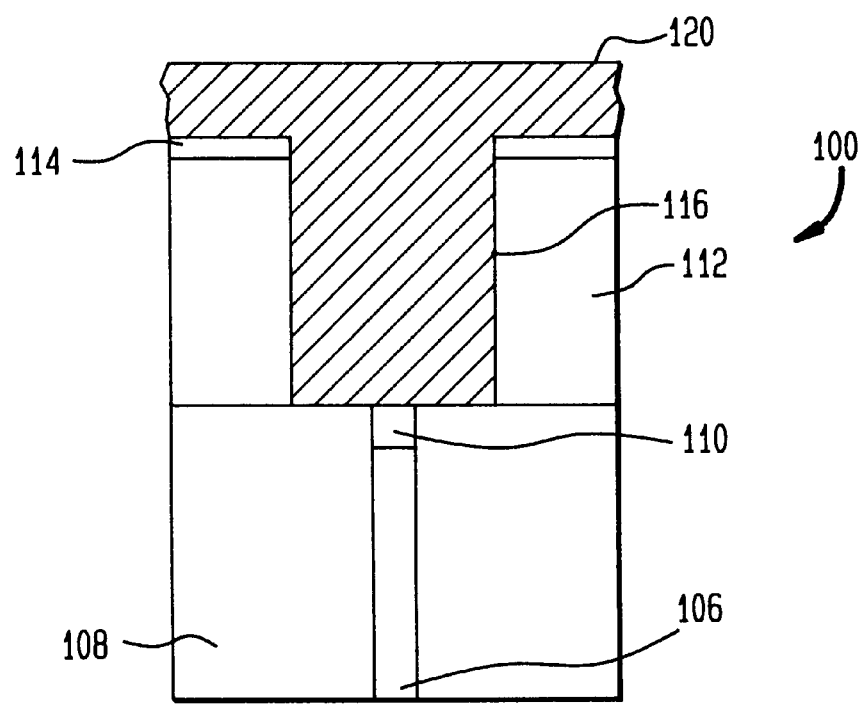
FIG. 6 is a cross-sectional view of the trench of FIG. 5 showing a filler material deposited therein accordance with the present invention.
Figure 7:
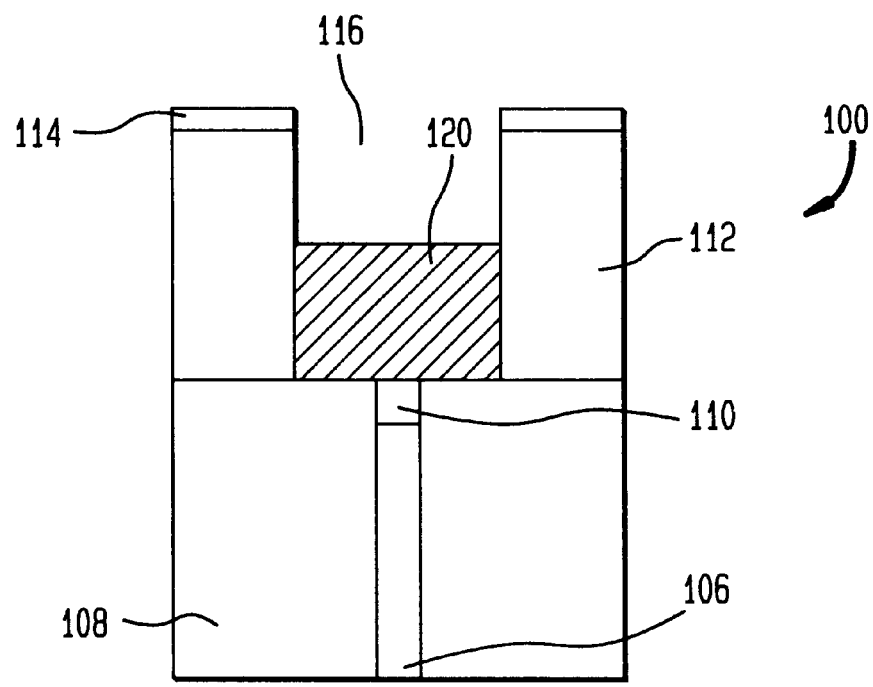
FIG. 7 is a cross-sectional view of the trench of FIG. 6 showing the filler material recessed to a predetermined depth in the trench in accordance with the present invention.
Figure 8:
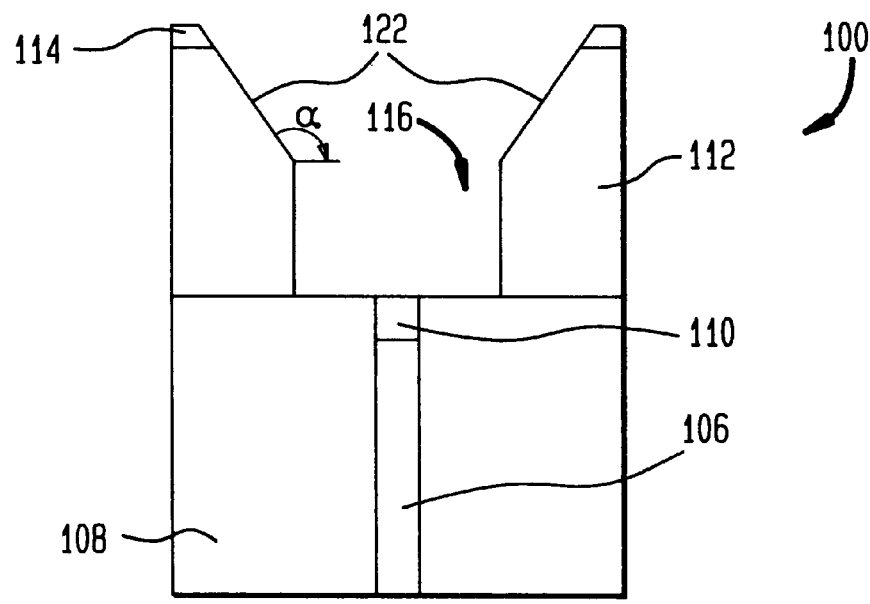
FIG. 8 is a cross-sectional view of the trench of FIG. 7 showing a tapered surfaces formed on sidewalls of the trench in accordance with the present invention.

Referring to FIGS. 6, 7 and 8, a filler material 120 is deposited within trench 116 preferably by a sputtering process. Filler material 120 may be a resist material known in the art (FIG. 6). Filler material 120 is removed to a predetermined depth in trench 116 preferably by a resist erosion RIE process (FIG. 7). Tapered surfaces 122 are formed on sidewalls 118 by performing an etching process, for example an isotropic and/or an anisotropic RIE process (FIG. 8). In a preferred embodiment, tapered surfaces 122 in trench 116 form a conically shaped portion within trench 116. Process parameters may be advantageously adjusted to vary the taper angle, $\alpha$, of tapered surfaces 122. Remaining resist is removed from within trench 116 so that further processing may be performed.

Figure 1:
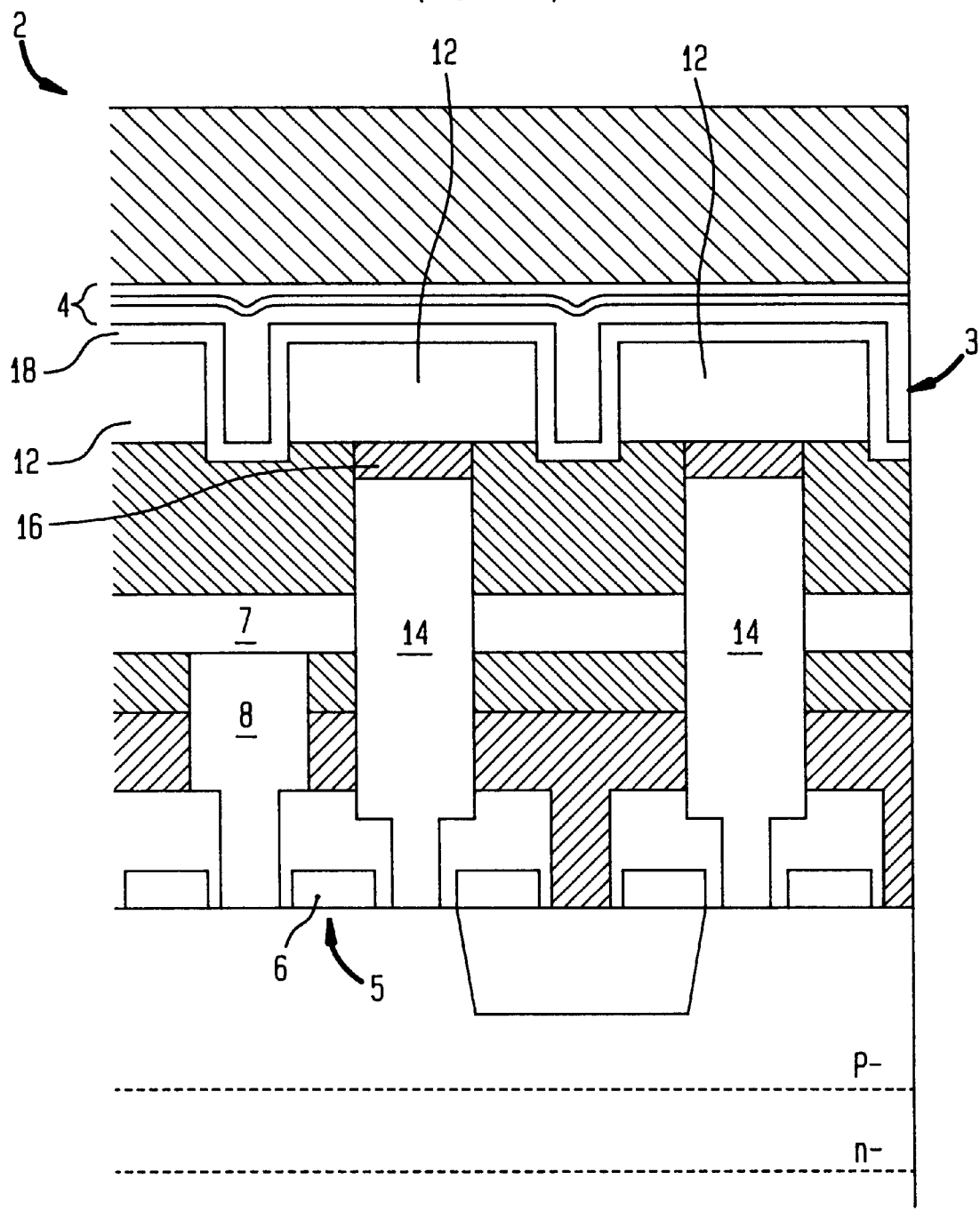
FIG. 1 is a cross-sectional view of stacked capacitors on a semiconductor device in accordance with the prior art.
Figure 2:
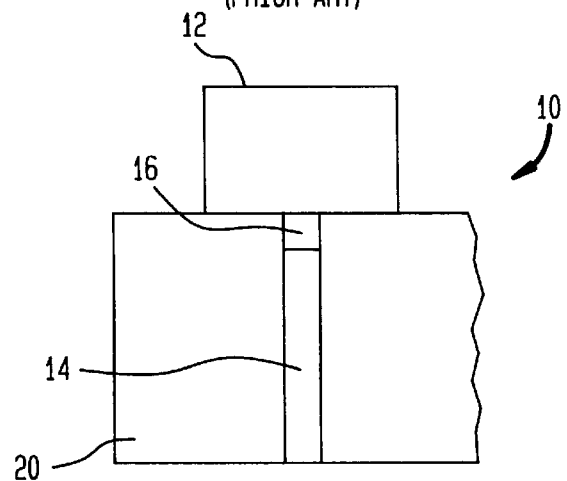
FIG. 2 is a cross-sectional view of a portion of stacked capacitor in accordance with the prior art showing a thick bottom electrode.
Figure 3:
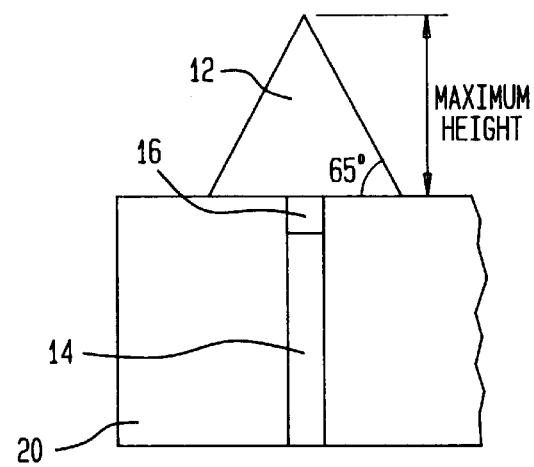
FIG. 3 is a cross-sectional view of a portion of a stacked capacitor in accordance with the prior art showing tapering due to etching bottom electrodes and a maximum height of the bottom electrodes.
Figure 4:
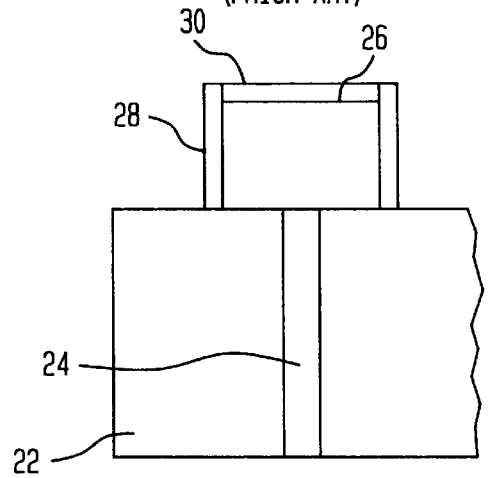
FIG. 4 is a cross-sectional view of a portion of a stacked capacitor in accordance with the prior art showing metal sidewalls for the bottom electrode.

Referring to FIG. 9, a bottom electrode 124 is formed by depositing a metal layer 126, preferably a noble metal such as platinum (Pt), Iridium (Ir), Ruthenium (Ru) or Ruthenium oxide (RuO$_2$) may be used or combinations thereof, over a top surface including sidewalls 118 (and tapered surfaces 122). Metal layer 126 of bottom electrode 124 may be deposited by CVD, PECVD or other known methods. By depositing metal layer 126 on tapered surfaces 122 and sidewalls 118, greater conformality is achieved, relative to the vertical surfaces of the prior art, for metal layer 126 and a high dielectric constant material to be deposited in later steps. Further, since metal layer 126 is deposited on tapered surfaces 122, increased surface area for stacked capacitor 100 is realized relative the reduced surface area typical of prior art designs (See FIG. 2). In a preferred embodiment of the present invention, bottom electrode 124 tapers outward in a conical shape thereby providing more metal material then the vertical walls of the prior art. Surface area is increased by, for example about 16% relative to the prior art. This area may be varied according to the taper angle a. The present invention, advantageously provides a stacked capacitor having a surface area sufficient for use with feature sizes of 0.15 microns or less. The present invention also provides the advantages described for feature sizes greater than 0.15 microns as well.

After the deposition of metal layer 126, metal layer 126 is coated by with a protective dielectric material 128. The remaining empty portion of trench 116 is also filled with protective dielectric material 128. Protective dielectric material 128 may include an oxide.

Referring to FIG. 10, a top surface 130 of protective dielectric material 128 is planarized down to metal layer 126. Planarization may be performed by a chemical-mechanical polish (CMP) or by an etch back process. Portions 132 of metal layer 126 above mask layer 114 are used as a stop for the planarization.

Figure 11:
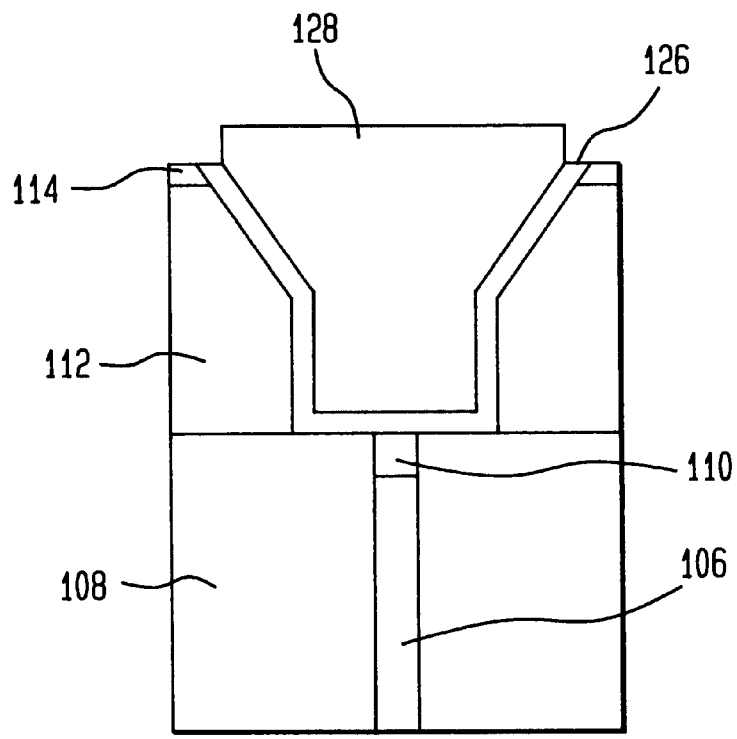
FIG. 11 is a cross-sectional view of the trench of FIG. 10 showing portions of the bottom electrode removed in accordance with the present invention.

Referring to FIG. 11, portions 132 are removed down to mask layer 114. Protective dielectric material 128 protects metal layer 126 from damage or removal during the removal of portions 132. Portions 132 may be removed by a metal RIE process or a metal CMP process. Mask layer 114 is advantageously used as a stop.

Figure 12:
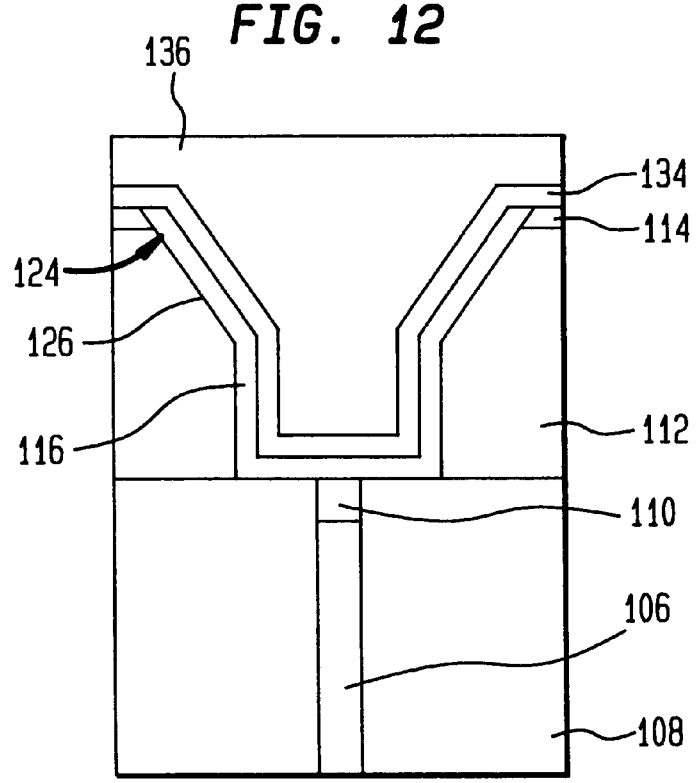
FIG. 12 is a cross-sectional view of the trench of FIG. 11 showing a high dielectric constant layer deposited on the bottom electrode and a top electrode filling the trench and on top of the high dielectric constant layer in accordance with the present invention.

Referring to FIG. 12, a wet etch process is preferably used to remove protective dielectric layer 128 thereby exposing metal layer 126. A high dielectric constant layer 134 is formed on metal layer 126. Metal layer 126 forms bottom electrode 124 of the stacked capacitor. A top electrode 136 is formed by depositing a conductive material over high dielectric constant layer 134 and in trench 116. Top electrode 136 is preferably formed from platinum although other conductive materials such as Iridium (Ir), Ruthenium (Ru) or Ruthenium oxide (RuO$_2$) may be used. High dielectric constant layer 134 is preferably formed from BSTO.

Top electrode 136 and bottom electrode 124 are separated by high dielectric constant layer 134 thereby forming a capacitor in accordance with the present invention. Top electrode 136 and bottom electrode 124 of stacked capacitor 100 advantageously have their surface area increased due to the tapered surfaces provided on the trench sidewalls. Since the deposition of metals and high dielectric constant layers are difficult to provide on vertical surfaces, tapered surfaces provide enhanced capability of utilizing theses layers in the stacked capacitor.

Having described preferred embodiments for a novel stack capacitor and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a stacked capacitor comprising the steps of:

providing a first insulating layer having a conductive access path therethrough;

forming a second insulating layer on the first insulating layer;

forming a trench in the second insulating layer;

depositing a resist material in the trench;

recessing the resist material to a predetermined depth within the trench;

anisotropically etching the trench sidewalls to form tapered surfaces to form tapered sidewalls of the trench;

forming a first electrode in the trench and on the tapered sidewalls, the first electrode being electrically coupled to the conductive access path;

forming a dielectric layer on the first electrode; and forming a second electrode on the dielectric layer.

2. The method as recited in claim 1, wherein the step of forming a trench in the second insulating layer, the trench having tapered sidewalls includes the step of forming the trench by reactive ion etching.

3. The method as recited in claim 1, wherein the tapered sidewalls form a conical shaped portion in the trench.

4. The method as recited in claim 1, wherein the step of forming a first electrode in the trench and on the trench sidewalls includes the step of depositing a metal layer in the trench which covers the sidewalls.

5. The method as recited in claim 1, further comprises the step of adjusting a taper angle of the sidewalls.

6. The method as recited in claim 1, wherein the step of forming a dielectric layer on the first electrode includes the step of forming a layer of barium strontium titanium oxide.

7. The method as recited in claim 1, wherein the first electrode includes platinum.

8. The method as recited in claim 1, wherein the first electrode includes one of Iridium, Ruthenium and Ruthenium oxide.

9. A method of fabricating a stacked capacitor for a semiconductor device comprising the steps of:

providing a first insulating layer having a conductive plug formed therethrough, the conductive plug for connecting to an access transistor of the semiconductor device;

forming a second insulating layer on the first insulating layer;

etching a trench in the second insulating layer to gain access to the conductive plug;

tapering sidewalls of the trench to form tapered surfaces within the trench depositing a resist material in the trench:

recessing the resist material to a predetermined depth within the trench; and anisotropically etching trench sidewalls to form the tapered surfaces;

forming a first electrode in the trench and on the tapered surfaces, the first electrode being electrically coupled to the conductive plug;

forming a dielectric layer on the first electrode; and forming a second electrode on the dielectric layer.

10. The method as recited in claim 9, wherein the semiconductor device is a memory chip.

11. The method as recited in claim 9, wherein the step of etching a trench in the second insulating layer to gain access to the conductive plug includes the step of reactive ion etching the trench.

12. The method as recited in claim 9, wherein the tapered surfaces form a conical shaped portion in the trench.

13. The method as recited in claim 9, wherein the step of tapering sidewalls of the trench to form tapered surfaces within the trench includes an anisotropic etch process.

14. The method as recited in claim 9, further comprises the step of adjusting a taper angle of the tapered surfaces.

15. The method as recited in claim 9, wherein the step of forming a dielectric layer on the first electrode includes the step of forming a layer of barium strontium titanium oxide.

16. The method as recited in claim 9, wherein the first electrode includes platinum.

17. The method as recited in claim 9, wherein the first electrode includes one of Iridium, Ruthenium and Ruthenium oxide.

* * * * *

UNITED STATES PATENT AND TRADEMARK OFFICE
CERTIFICATE OF CORRECTION

PATENT NO. : 6,165,864
DATED : Dec. 26, 2000
INVENTOR(S) : Shen et al.

It is certified that error appears in the above-identified patent and that said Letters Patent is hereby corrected as shown below:

Title page, should read as follows:

(73) Assignee: Siemens Aktiengesellschaft, Munich, Germany
and
International Business Machines Corporation, Armonk, NY Signed and Sealed this Twenty-eighth Day of August, 2001

*Attest:*

Nicholas P. Godici

NICHOLAS P. GODICI
*Attesting Officer*    *Acting Director of the United States Patent and Trademark Office*